(12) United States Patent
Agarwal et al.

(10) Patent No.: US 8,581,634 B2
(45) Date of Patent: Nov. 12, 2013

(54) SOURCE FOLLOWER INPUT BUFFER

(75) Inventors: Nitin Agarwal, Bangalore (IN); Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 267 days.

(21) Appl. No.: 12/763,945

(22) Filed: Apr. 20, 2010

(65) Prior Publication Data
US 2011/0204930 A1 Aug. 25, 2011

(30) Foreign Application Priority Data
Feb. 24, 2010 (IN) .............................. 482/CHE/2010

(51) Int. Cl.
*G11C 27/02* (2006.01)

(52) U.S. Cl.
USPC .............................................. 327/91; 327/92

(58) Field of Classification Search
USPC ....................................................... 327/91–95
See application file for complete search history.

(56) References Cited

U.S. PATENT DOCUMENTS

| | | | |
|---|---|---|---|
| 4,099,245 A * | 7/1978 | Maysonett | ......................... 708/4 |
| 4,634,993 A | 1/1987 | Koen | |
| 5,764,175 A | 6/1998 | Pan | |
| 5,872,469 A | 2/1999 | Nestler | |
| 6,255,865 B1 | 7/2001 | Opris | |
| 6,400,301 B1 * | 6/2002 | Kulhalli et al. | ............... 341/155 |
| 7,385,427 B2 | 6/2008 | Lim | |
| 7,427,892 B2 * | 9/2008 | Fujikura et al. | ............... 327/540 |
| 2001/0052819 A1 | 12/2001 | Kubota | |
| 2009/0206885 A1 | 8/2009 | Sundblad et al. | |

FOREIGN PATENT DOCUMENTS

WO    WO2007093475    8/2007

OTHER PUBLICATIONS

"On the Performance and Use of an Improved Source—Follower Buffer," IEEE Transactions on Circuits and Systems—I: Regular Papers, Vol. 54, No. 3, Mar. 2007, pp. 504-517 (Rapakko, et al.).
"A 150-MS/s 8-b 71-mW CMOS Time-Interleaved ADC," IEEE Journal of Solid-State Circuits, vol. 40, No. 5, May 2005, pp. 1057-1067 (Limotyrakis, et al.).
"A 50MS/s 9.9mW Pipelined ADC with 58dB Sndr in 0.18μm CMOS Using Capacitive Charge-Pumps," 2009 IEEE International Solid-State Circuits Conference, pp. 164-166 (Ahmed, et al.).
"A 1-GHz 6-bit ADC System,"IEEEJournalofSolid-StateCircuits,vol. SC-22,No. 6, Dec. 1987, pp. 962-970 (Poulton, et al.).
PCT Search Report mailed Aug. 11, 2011.
U.S. Appl. No. 12/199,804, filed Aug. 28, 2008.

* cited by examiner

*Primary Examiner* — Lincoln Donovan
*Assistant Examiner* — Diana J Cheng
(74) *Attorney, Agent, or Firm* — Alan A. R. Cooper; W. James Brady, III; Frederick J. Telecky, Jr.

(57) ABSTRACT

Traditionally, input source follower buffers for analog-to-digital converters (ADCs) lacked sufficiently high linearity. This was due in part to source follower buffers having to drive external capacitive loads by generally providing a signal current to the capacitive load. Here, a buffer is provided that includes a source follower buffer and other biasing circuitry (which provided the signal current). Thus, the overall linearity of the input circuitry (namely, the input buffer) is improved.

19 Claims, 2 Drawing Sheets

SOURCE FOLLOWER INPUT BUFFER

CROSS-REFERENCE TO RELATED APPLICATIONS

This application claims priority from Indian Patent Application No. 482/CHE/2010, filed Feb. 24, 2010, which is hereby incorporated by reference for all purposes.

TECHNICAL FIELD

The invention relates generally to buffers and, more particularly, to source follower buffers with a reduced input capacitance load.

BACKGROUND

Referring to FIG. 1 of the drawings, the reference numeral 100 generally designates conventional input circuitry for an analog-to-digital converter (ADC). Circuit 100 is generally described in co-pending patent application Ser. No. 12/199,804, which is hereby incorporated by reference for all purposes. As shown, circuit 100 generally comprises a transmission medium (represented by inductor L1), buffer 102 and sample-and-hold (S/H) circuit 104. Buffer 102 generally comprises NMOS transistor Q1 (which is coupled to inductor L1), cascoded NMOS transistors Q2 and Q3 (which receive bias voltages NCAS and NBIAS at their respective gates), and capacitor C1. S/H circuit 102 is generally represented (for the sake of simplicity of explanation) as resistor RS, sampling switch SS, and sampling capacitor CS.

With many conventional buffers, the "off-chip" driver that drives transistor Q1 (which is generally a source follower) can drive (moderate) continuous time loads but not switching loads (which are present with the use of S/H circuit 104). In this configuration, capacitor C1 (which is generally the same size as capacitor CS) provides a signal current for the load (by way of the transistor Q2), while the source follower (transistor Q1) is able to generally define the voltage for the switching load (S/H circuit 104). It is desired to keep the capacitor C1 small as it loads the "off-chip" driver. This will mean that transistor Q1 will also provide some portion of signal current. This configuration, with this additional constraint of small capacitor C1, can not only be problematic with respect to its inability to drive switching load but can also significantly and adversely impact the spurious free dynamic range (SFDR) of an interleaved ADC when used in an interleaved ADC, which uses many buffers to drive multiple S/H circuits. Therefore, there is a need for a circuit with improved performance.

Some other conventional circuits are: U.S. Pat. No. 4,634,993; U.S. Pat. No. 5,764,175; U.S. Pat. No. 5,872,469; U.S. Pat. No. 6,255,865; U.S. Pat. No. 7,385,427; U.S. Pre-Grant Publ. No. 20090206885; and PCT Publ. No. WO07/093,475.

SUMMARY

A preferred embodiment of the present invention, accordingly, provides an apparatus. The apparatus comprises a biasing circuit having: a first capacitor having a first capacitance that receives a first portion of an input signal; and a pair of cascoded transistors, wherein the first capacitor is coupled to a node between the cascaded transistors, and wherein a first cascoded transistor of the pair of cascoded receives a first bias voltage, and wherein a second cascoded transistor of the pair of cascoded transistors receives a second bias voltage; a switched capacitor circuit having a second capacitance; and a source follower buffer that is coupled to the biasing circuit and the switched capacitor circuit, wherein the source follower receives the second bias voltage and receives a second portion of the input signal, and wherein the source follower includes a second capacitor having a third capacitance, and wherein the ratio of first capacitance to the combined second and third capacitances is at least one In accordance with a preferred embodiment of the present invention, the source follower buffer further comprises a plurality of source follower buffers that are each coupled to the biasing circuit and that each receive the second portion of the input signal.

In accordance with a preferred embodiment of the present invention, the first cascoded transistor further comprises a first NMOS transistor that receives the first bias voltage at its gate, and wherein the second cascoded transistor is a second NMOS transistor that is coupled to the source of the first NMOS transistor at its drain and to the drain of the first NMOS transistor at its gate, and wherein the first capacitor is coupled to the drain of the second NMOS transistor.

In accordance with a preferred embodiment of the present invention, the biasing circuit further comprises a current source that is coupled to the drain of the first NMOS transistor.

In accordance with a preferred embodiment of the present invention, the source follower buffer further comprises: a third NMOS transistor that receives the second portion of the input signal at its gate and that is coupled to the second capacitor at its source; and a fourth NMOS transistor that is coupled to the gate of the second NMOS transistor at its gate and that is coupled to the source of the third NMOS transistor at is drain.

In accordance with a preferred embodiment of the present invention, the body of the third NMOS transistor is coupled to the second capacitor.

In accordance with a preferred embodiment of the present invention, the ratio is 10:1.

In accordance with a preferred embodiment of the present invention, the switch capacitor circuit is a sample-and-hold (S/H) circuit.

In accordance with a preferred embodiment of the present invention, an apparatus is provided. The apparatus comprises a biasing circuit having: a first capacitor having a first capacitance that receives a first portion of an input signal; and a pair of cascoded transistors, wherein the first capacitor is coupled to a node between the cascaded transistors, and wherein a first cascoded transistor of the pair of cascoded receives a first bias voltage, and wherein a second cascoded transistor of the pair of cascoded transistors receives a second bias voltage; a source follower buffer that is coupled to the biasing circuit so as to receive the second bias voltage and that receives a second portion of the input signal, wherein the source follower includes a second capacitor having a second capacitance; an S/H circuit that is coupled to the source follower buffer having a third capacitance, wherein the ratio of the first capacitance to the combined second and third capacitances is at least one; an analog-to-digital converter (ADC) pipeline that is coupled to the S/H circuit; and clocking circuitry that is coupled to the S/H circuit and the ADC pipeline.

In accordance with a preferred embodiment of the present invention, the source follower buffer further comprises a plurality of source follower buffers that are each coupled to the biasing circuit and that each receive the second portion of the input signal, and wherein the S/H circuit further comprises a plurality of S/H circuit that are each coupled to at least one of the source follower buffers, and wherein the ADC pipeline further comprises a plurality of ADC pipelines that are each coupled to at least one of the S/H circuits.

In accordance with a preferred embodiment of the present invention, the apparatus further comprises a multiplexer that is coupled to each ADC pipeline.

In accordance with a preferred embodiment of the present invention, an apparatus is provided. The apparatus comprises a biasing circuit having: a current source; a first NMOS transistor that is coupled to the current source at its drain and that receives a bias voltage at its gate; a second NMOS transistor that is coupled to the source of the first NMOS transistor at its drain and that is coupled to the drain of the first NMOS transistor at its gate; and a first capacitor having a first capacitance that receives a first portion of an input signal and that is coupled to the drain of the second NMOS transistor; a plurality of source follower buffers, wherein each source follower buffer includes: a third NMOS transistor that receives a second portion of the input signal at its gate; a fourth NMOS transistor that is coupled to the source of the third NMOS transistor at its drain and that is coupled to gate of the second NMOS transistor at its gate; and a second capacitor having a second capacitance that is coupled to the source of the third NMOS capacitor; a plurality of S/H circuits, wherein each S/H circuit is coupled to at least one of the source follower buffers at the source of its third NMOS transistor, and wherein each S/H circuit has a third capacitance, and wherein the ratios of the first capacitance to the combined second and third capacitances for each S/H circuits and its corresponding follower buffer is at least one; a plurality of ADC pipelines, wherein each ADC pipeline is coupled to at least one of the S/H circuits; a multiplexer that is coupled to each ADC pipeline; and clocking circuitry that is coupled to each S/H circuit and each ADC pipeline.

In accordance with a preferred embodiment of the present invention, the body of the third NMOS transistor is coupled to the second capacitor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
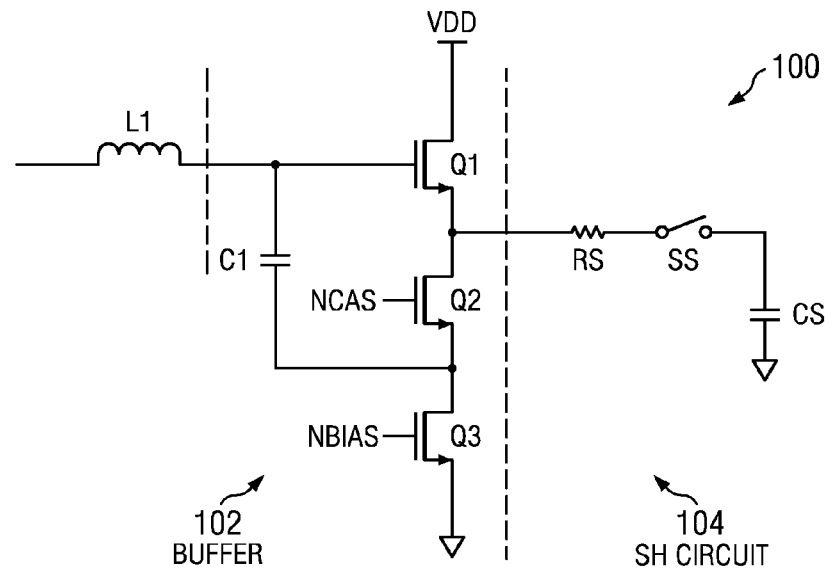
FIG. 1 is a circuit diagram of conventional input circuitry for an ADC.

Refer now to the drawings wherein depicted elements are, for the sake of clarity, not necessarily shown to scale and wherein like or similar elements are designated by the same reference numeral through the several views.

Figure 2:
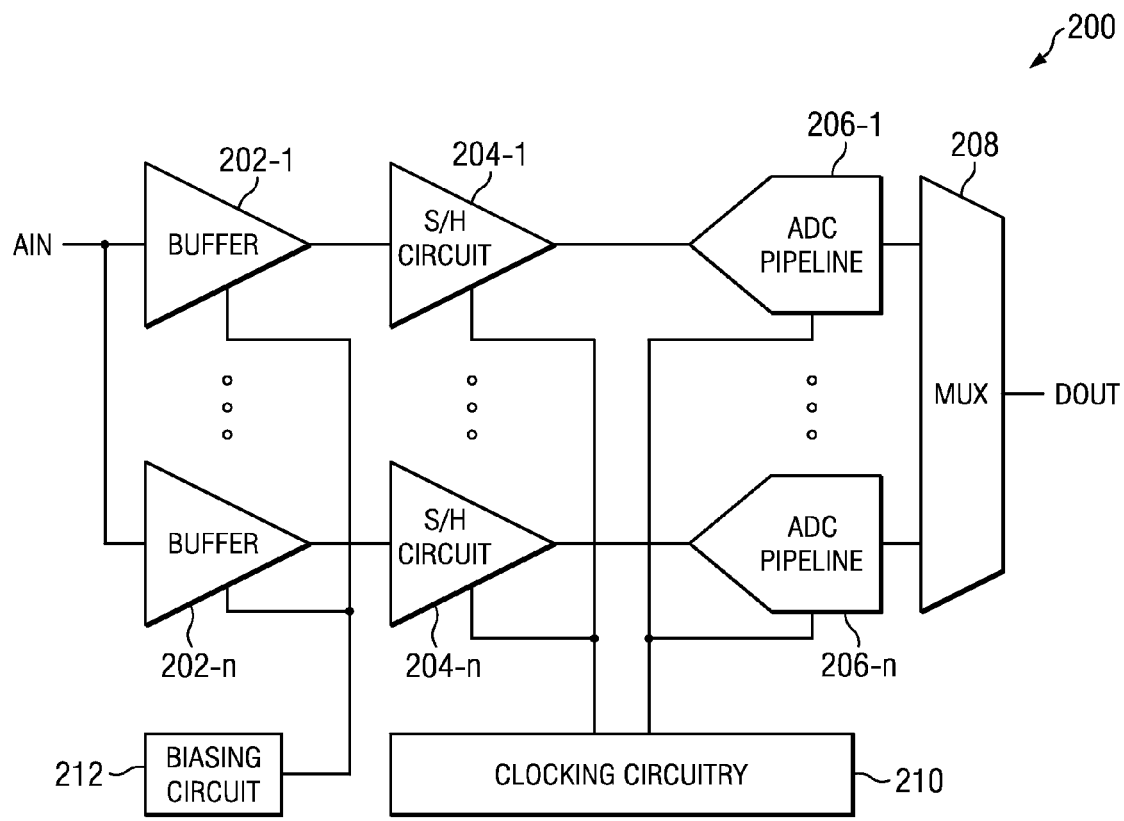
FIG. 2 is a block diagram of an interleaved ADC in accordance with a preferred embodiment of the present invention.

Turning to FIG. 2 of the drawings, an interleaved ADC 200 in accordance with a preferred embodiment of the present invention can be seen. In operation, an analog input signal AIN is provided to buffers 202-1 to 202-n (which are each coupled to biasing circuit 212). The output from each buffer 202-1 to 202-n is coupled to a corresponding S/H circuit 204-1 to 204-n, so that the input signal AIN can be sampled and provided to the corresponding ADC pipeline 206-1 to 206-n for conversion. Clocking circuit 210, which is coupled to the S/H circuits 204-1 to 204-n and ADC pipelines 206-1 to 206-n, provides timings signals to sample the input signal AIN and convert it to a digital signal. The interleaved digital output signals from ADC pipelines 206-1 to 206-n are then multiplexed by multiplexer (or mux) 208 to generate digital output signal DOUT.

Figure 3:
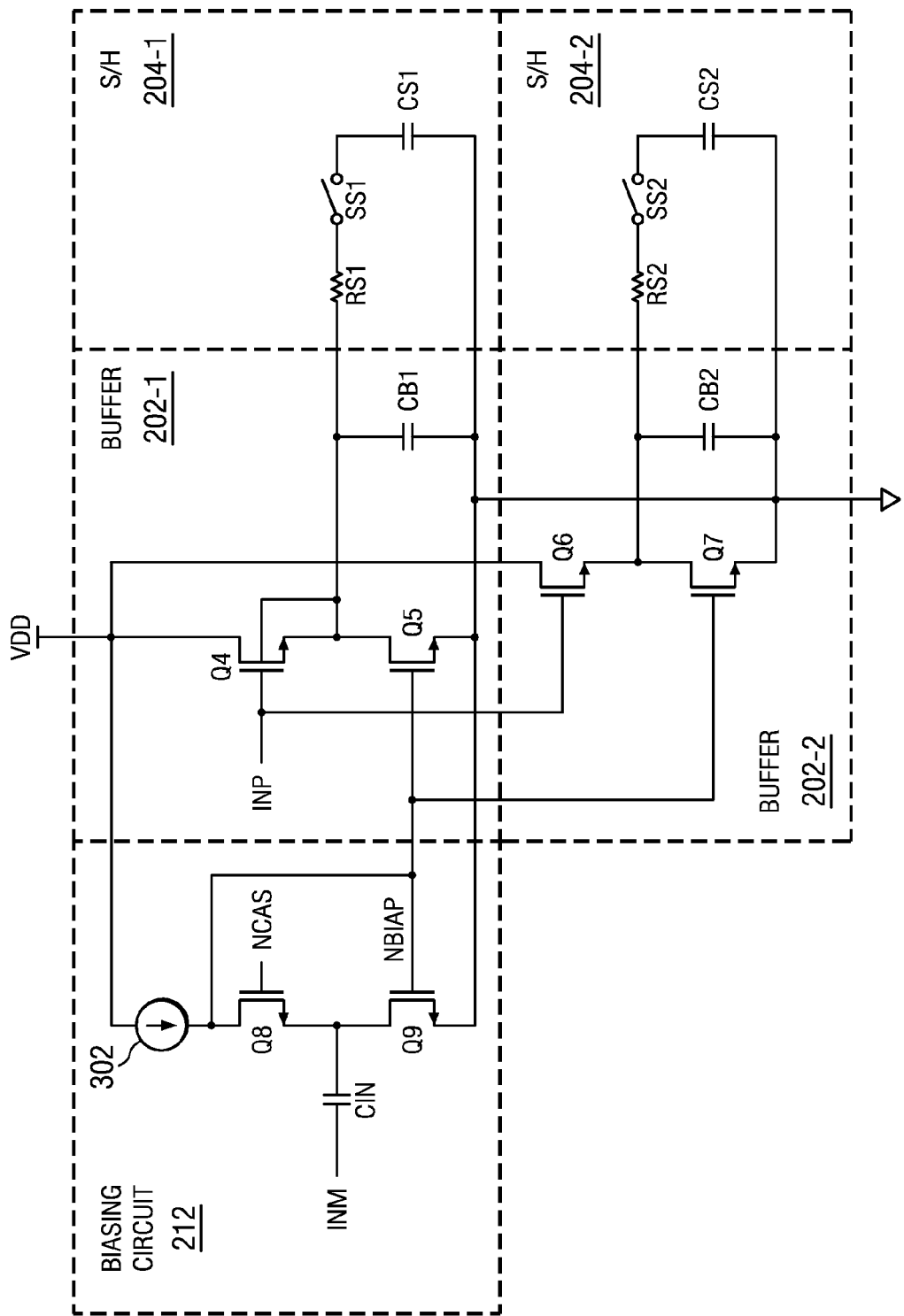
FIG. 3 is a circuit diagram of a portion of the ADC of FIG. 2.

Tuning now to FIG. 3, a more detailed view of the bias circuit 212, buffers 202-1 and 202-2, and S/H circuits 204-1 and 204-2. For the sake of simplicity, input circuitry for two ADC pipelines is shown. Additionally, for the sake of simplicity, S/H circuits 204-1 and 204-2 are represented by resistors R1 and R2, sampling switches SS1 and SS2, and sampling capacitors CS1 and CS2. The biasing circuit 212 generally comprises capacitor CIN, NMOS transistors Q8 and Q9, and current source 302. Buffer 202-1 generally comprises NMOS transistors Q4 and Q5 and capacitor CB1, while buffer 202-2 generally comprises NMOS transistors Q6 and Q7 and capacitor CB2.

In operation, portions (INP and INM) of the input signal AIN are provided to the biasing circuit 212 and buffers 202-1 and 202-2 so that the input signal AIN can be sampled by the S/H circuits 204-1 and 204-2. Current source 302 provides a current to the drain of NMOS transistor (which receives a bias voltage NCAS at its gate) and provides a bias voltage NBIASP to the gate of NMOS transistor Q9. Portion INM is provided to the node between cascoded NMOS transistors Q8 and Q9 through capacitor CIN. This enables a signal current to flow from ground through transistor Q9 and capacitor CIN. This signal current is mirrored by each of NMOS transistors Q5 and Q7 so that it can be provided to capacitors CB1 and CB2. Additionally, portion INP is provided to the gates of NMOS transistors Q4 and Q6 (which each operate as source followers) and do not generally provide the signal current. Thus, this input circuitry is able to sufficient voltages and currents to S/H circuit 204-1 and 204-2 with improved linearity.

The capacitance of capacitors CIN, CB1, CB2, CS1, and CS2 are also generally scaled. Typically, the combined capacitances each of capacitors CB1 and CS1 and capacitors and CB2 and CS2 are at least the same as or smaller than the capacitance of capacitor CIN (which operates as a compensation capacitor). For example, the ratio of the combined capacitance of capacitors CB1 and CS1 and the capacitance of capacitor CIN can be 1:10. It should also be noted that capacitor CIN is coupled to a very low impedance node (which has a small non-linear voltage) so as to generally eliminated a source of non-linearity over other conventional circuits. Additionally, signal current through an input is reduced, which also helps reduce electromagnetic interference that can become a limiting factor at high speeds.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
   a biasing circuit having:
      a first capacitor having a first capacitance that receives a first portion of an input signal so as to receive a signal current; and
      a pair of cascoded transistors, wherein the first capacitor is coupled to a node between the cascoded transistors, and wherein a first cascoded transistor of the pair of cascoded receives a first bias voltage, and wherein a second cascoded transistor of the pair of cascoded transistors receives a second bias voltage;
   a switched capacitor circuit having a second capacitance; and
   a source follower buffer that is coupled to the biasing circuit and the switched capacitor circuit, wherein the source follower receives the second bias voltage and receives a second portion of the input signal, and wherein the source follower includes a second capacitor having a third capacitance, and wherein the ratio of first capacitance to the combined second and third capacitances is at least one, and wherein the source follower buffer mirrors the signal current.

2. The apparatus of claim 1, wherein the source follower buffer further comprises a plurality of source follower buffers that are each coupled to the biasing circuit and that each receive the second portion of the input signal.

3. The apparatus of claim 1, wherein the first cascoded transistor further comprises a first NMOS transistor that receives the first bias voltage at its gate, and wherein the second cascoded transistor is a second NMOS transistor that is coupled to the source of the first NMOS transistor at its drain and to the drain of the first NMOS transistor at its gate, and wherein the first capacitor is coupled to the drain of the second NMOS transistor.

4. The apparatus of claim 3, wherein the biasing circuit further comprises a current source that is coupled to the drain of the first NMOS transistor.

5. The apparatus of claim 4, wherein the source follower buffer further comprises:
   a third NMOS transistor that receives the second portion of the input signal at its gate and that is coupled to the second capacitor at its source; and
   a fourth NMOS transistor that is coupled to the gate of the second NMOS transistor at its gate and that is coupled to the source of the third NMOS transistor at is drain.

6. The apparatus of claim 5, wherein the body of the third NMOS transistor is coupled to the second capacitor.

7. The apparatus of claim 6, wherein the ratio is 10:1.

8. The apparatus of claim 1, wherein the switch capacitor circuit is a sample-and-hold (S/H) circuit.

9. An apparatus comprising:
   a biasing circuit having:
      a first capacitor having a first capacitance that receives a first portion of an input signal so as to receive a signal current; and
      a pair of cascoded transistors, wherein the first capacitor is coupled to a node between the cascoded transistors, and wherein a first cascoded transistor of the pair of cascoded receives a first bias voltage, and wherein a second cascoded transistor of the pair of cascoded transistors receives a second bias voltage;
   a source follower buffer that is coupled to the biasing circuit so as to receive the second bias voltage and that receives a second portion of the input signal, wherein the source follower includes a second capacitor having a second capacitance, and wherein the source follower buffer mirrors the signal current;
   an S/H circuit that is coupled to the source follower buffer having a third capacitance, wherein the ratio of the first capacitance to the combined second and third capacitances is at least one;
   an analog-to-digital converter (ADC) pipeline that is coupled to the S/H circuit; and
   clocking circuitry that is coupled to the S/H circuit and the ADC pipeline.

10. The apparatus of claim 9, wherein the source follower buffer further comprises a plurality of source follower buffers that are each coupled to the biasing circuit and that each receive the second portion of the input signal, and wherein the S/H circuit further comprises a plurality of S/H circuit that are each coupled to at least one of the source follower buffers, and wherein the ADC pipeline further comprises a plurality of ADC pipelines that are each coupled to at least one of the S/H circuits.

11. The apparatus of claim 10, wherein the apparatus further comprises a multiplexer that is coupled to each ADC pipeline.

12. The apparatus of claim 9, wherein the first cascoded transistor further comprises a first NMOS transistor that receives the first bias voltage at its gate, and wherein the second cascoded transistor is a second NMOS transistor that is coupled to the source of the first NMOS transistor at its drain and to the drain of the first NMOS transistor at its gate, and wherein the first capacitor is coupled to the drain of the second NMOS transistor.

13. The apparatus of claim 12, wherein the biasing circuit further comprises a current source that is coupled to the drain of the first NMOS transistor.

14. The apparatus of claim 13, wherein the source follower buffer further comprises:
   a third NMOS transistor that receives the second portion of the input signal at its gate and that is coupled to the second capacitor at its source; and
   a fourth NMOS transistor that is coupled to the gate of the second NMOS transistor at its gate and that is coupled to the source of the third NMOS transistor at is drain.

15. The apparatus of claim 14, wherein the body of the third NMOS transistor is coupled to the second capacitor.

16. The apparatus of claim 15, wherein the ratio is 10:1.

17. An apparatus comprising:
   a biasing circuit having:
      a current source;
      a first NMOS transistor that is coupled to the current source at its drain and that receives a bias voltage at its gate;
      a second NMOS transistor that is coupled to the source of the first NMOS transistor at its drain and that is coupled to the drain of the first NMOS transistor at its gate; and
      a first capacitor having a first capacitance that receives a first portion of an input signal so as to receive a signal current and that is coupled to the drain of the second NMOS transistor;
   a plurality of source follower buffers, wherein each source follower buffer includes:
      a third NMOS transistor that receives a second portion of the input signal at its gate;

a fourth NMOS transistor that is coupled to the source of the third NMOS transistor at its drain and that is coupled to gate of the second NMOS transistor at its gate; and a second capacitor having a second capacitance that is coupled to the source of the third NMOS capacitor;

a plurality of S/H circuits, wherein each S/H circuit is coupled to at least one of the source follower buffers at the source of its third NMOS transistor, and wherein each S/H circuit has a third capacitance, and wherein the ratios of the first capacitance to the combined second and third capacitances for each S/H circuits and its corresponding follower buffer is at least one and wherein the source follower buffer mirrors the signal current;

a plurality of ADC pipelines, wherein each ADC pipeline is coupled to at least one of the S/H circuits;

a multiplexer that is coupled to each ADC pipeline; and clocking circuitry that is coupled to each S/H circuit and each ADC pipeline.

18. The apparatus of claim 17, wherein the body of the third NMOS transistor is coupled to the second capacitor.

19. The apparatus of claim 18, wherein the ratios are each 10:1.

* * * * *